United States Patent [19]

Breneman et al.

[11] Patent Number: 4,743,880
[45] Date of Patent: May 10, 1988

[54] MRI MAGNET SYSTEM HAVING SHIELD AND METHOD OF MANUFACTURE

[75] Inventors: Bruce C. Breneman; John R. Purcell, both of San Diego; Sibley C. Burnett, Cardiff, all of Calif.

[73] Assignee: GA Technologies Inc., San Diego, Calif.

[21] Appl. No.: 101,518

[22] Filed: Sep. 28, 1987

[51] Int. Cl.[4] .............................................. H01F 7/00
[52] U.S. Cl. .................................... 335/301; 335/216; 324/320
[58] Field of Search ....................... 335/216, 301, 299; 324/318, 319, 320; 29/599

[56] References Cited

U.S. PATENT DOCUMENTS

| | | | |
|---|---|---|---|
| 4,490,675 | 12/1984 | Knuettel et al. | 324/319 |
| 4,590,452 | 5/1986 | Ries et al. | 335/301 |
| 4,612,505 | 9/1986 | Zijlstra | 324/318 |
| 4,635,017 | 1/1987 | Ries | 335/301 |
| 4,646,045 | 2/1987 | Chari et al. | 335/301 |
| 4,660,013 | 4/1987 | Laskaris et al. | 335/301 X |
| 4,673,881 | 6/1987 | Ries et al. | 335/301 X |

*Primary Examiner*—George Harris
*Attorney, Agent, or Firm*—Fitch, Even, Tabin & Flannery

[57] ABSTRACT

A magnet system for providing a localized, substantially homogeneous field for use in medical magnetic resonance imaging and its incorporation into a method of siting. The magnet system includes a vacuum vessel defining a bore for receiving the subject of the imaging and having a first end and a second end. A cryogenic containment vessel is supported within the vacuum vessel and a single coil is disposed within the containment vessel for providing the magnetic field. The magnetic system also includes a shield assembly of ferromagnetic material positioned closely adjacent the outside of the vacuum vessel and including first and second end assemblies and a plurality of axially extending beam-like members interconnecting the end assemblies. The coil comprises a winding made up of thousands of turns of small superconductive wire and which is configured to compensate for the effect of the presence of the shield to provide the substantially homogeneous field at a predetermined location in the bore. The components of the shield assembly are adapted for mounting to said vacuum vessel after siting. This permits simplified siting of the magnet system in that the vacuum vessel with the components inside of it can be sited first and the components of the shield assembly thereafter mounted on the vacuum vessel. A method of manufacturing the magnet system is also disclosed.

11 Claims, 4 Drawing Sheets

MRI MAGNET SYSTEM HAVING SHIELD AND METHOD OF MANUFACTURE

This invention relates to apparatus for providing a magnetic field and, more particularly, to a magnet system having a superconductive coil for providing a region inside the bore of the magnet having a very homogeneous magnetic field of high flux density and at the same time a shield for limiting the intensity of the magnetic field outside of the magnet.

BACKGROUND OF THE INVENTION

Magnetic resonance imaging (MRI) is becoming increasingly well accepted for medical diagnostics because of its advantages over computerized axial tomography scanners which subject the patient undergoing examination to potentially harmful x-rays. However, MRI magnets, without special shielding, provide relatively high magnetic flux density outside the bore of the magnet also. Space in hospitals is at a premium and high strength magnetic fields can cause interference with other hospital diagnostic equipment as well as with control devices such as cardiac pacemakers and neuro stimulators. Thus, it is necessary to provide shielding for the magnet, particularly in view of a United States Food and Drug Administration ruling that there be an area of exclusion provided at the five gauss flux line.

There are several ways to provide shielding for an MRI magnet. One is active shielding in which additional coils are employed so as to provide magnetic fields in opposition to the field provided by the magnet. Such additional coils are placed outside the magnet coil (in the helium cryostat) to reduce the field strength in the patient volume and cancel the field outside of the magnet. Besides the expense of the additional coils, which can add up to thirty percent to the cost of a magnet system, siting a magnet system employing active shielding presents severe problems. The magnet system is large, heavy and must be located as a single unit. It cannot be assembled from components at the site. Field uniformity in the bore must be provided for, for example, by the addition of shimming both inside and outside the bore to achieve the required magnetic field homogeneity.

The nominal bore diameter for an actively shielded magnet system is 100 cm. Such a large bore requires a large magnet main coil to provide sufficient flux to achieve the required high flux density in the bore. The large bore magnet system with a large main coil, also with the active shielding coils and attendant frame structure, results in a magnet system which weighs in the range of 15,000–20,000 lbs. Not only the site but also the floor of the path taken to the site, for example, in a hospital must be able to bear this load. The doorways through which the magnet system passes must be sufficiently large to permit its passage or expensive enlargement of the doorways must be provided.

Passive shielding is another method of limiting the field outside of the magnet. One type of passive shielding involves forming a room about the magnet with the walls of the room containing ferromagnetic material to provide a high permeability return path for the magnetic lines of force. This method of shielding has shortcomings in that it requires custom engineering and design for each site location and thus becomes very expensive. The weight of the iron in the walls may require structural reinforcement.

A second type of passive shielding entails placing a shield of ferromagnetic material in close proximity to the vacuum vessel of the magnet. Such a shield, of iron or low carbon steel, provides the high permeability return path for the lines of force to greatly limit the intensity of the field outside the magnet. Unfortunately, the presence of so much iron near the bore of the magnet greatly degrades the degree of homogeneity of the field inside the magnet bore. For example, a magnet providing a homogeneity of 5 parts per million (PPM) without the shield may provide 5000 ppm in the presence of the shield. Such a degree of nonuniformity is not suitable for MRI. In order to improve the degree of homogeneity inside the magnet bore, various correction or error coils (shim coils) are wound. It will be appreciated that the winding of such shim coils with respect to an existing magnet is time consuming and expensive. The presence of the shim coils occupies precious space in the bore and adds weight to the magnet system. For additional information regarding the structure and operation of prior art MRI magnets having shields and shim coils, reference may be made to U.S. Pat. Nos. 4,490,675; 4,590,452; 4,612,505 and 4,646,045.

SUMMARY OF THE INVENTION

Among the several aspects and features of the present invention may be noted the provision of an improved MRI magnet system and its incorporation in a unique method of siting. The system provides shielding to limit the strength of the magnetic field outside the magnet and has a single coil disposed inside the vacuum vessel which provides a high strength field with a high degree of homogeneity notwithstanding the presence of the shield because the coil is configured to cancel the effect of the presence of the iron shield. As the magnet system of the present invention avoids the need to place additional coils inside the magnet bore, the diameter of the bore can be reduced with the accompanying advantage that the size of the single coil is reduced because less flux is needed to provide the required flux density in the smaller bore. This results in a small, lighter (than other shielded magnet systems) and less expensive magnet system. The present system can also be assembled at the site in that the largest single component is the magnet which could weigh about 4500 lbs. The various iron pieces forming the shield can be transported to the site separately and assembled to form the shield at the site. The magnet system is reliable in use, has long service life and is relatively easy and economical to manufacture. Other aspects and features of the present invention will be, in part, apparent and, in part, pointed out hereinafter in the following specification and in the accompanying claims and drawings.

Briefly, a magnet system embodying various aspects of the present invention includes a vacuum vessel defining a bore for receiving the patient with a cryogenic containment vessel supported inside the vacuum vessel. A single coil is positioned in the containment vessel for providing the magnetic field. The system also includes a shield assembly of ferromagnetic material disposed closely adjacent the outside of the vacuum vessel. This shield assembly includes first and second end assemblies and a plurality of axially extending beam-like members interconnecting the end assemblies. The coil includes a winding made up of thousands of turns of small superconductive wire and configured to compensate for the effect of the presence of the shield to provide the substantially homogeneous field at a predetermined location in the bore.

BRIEF DESCRIPTION OF THE DRAWINGS

Corresponding reference characters indicate corresponding components throughout the several views of the drawings.

DESCRIPTION OF THE PREFERRED EMBODIMENT

Figure 1:
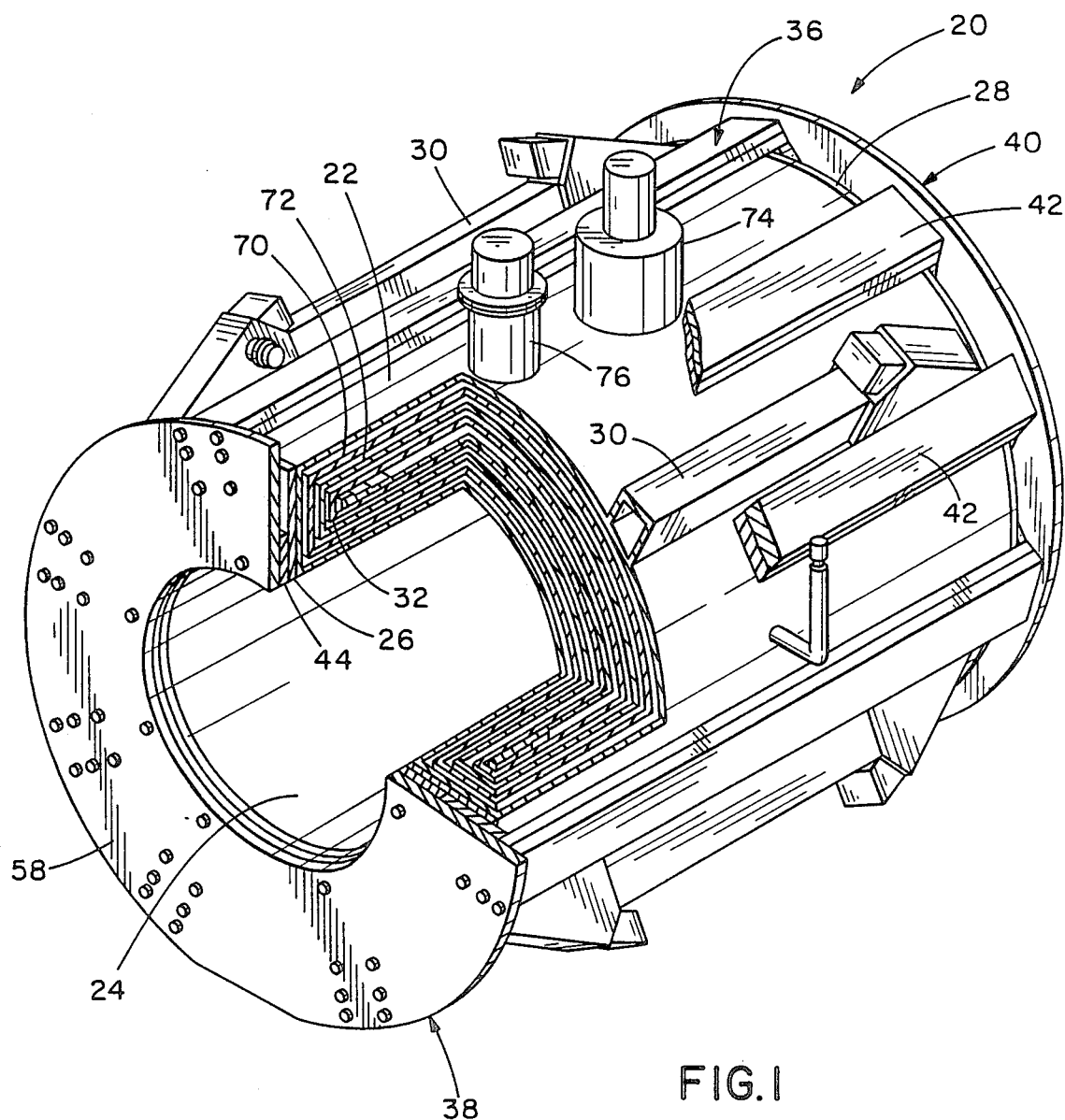
FIG. 1 is an isometric projection of an MRI magnet system embodying various aspects of the present invention including a magnet having a vacuum vessel containing a coil with a cage-like shield positioned about the magnet, with certain components removed to expose other components.
Figure 3:
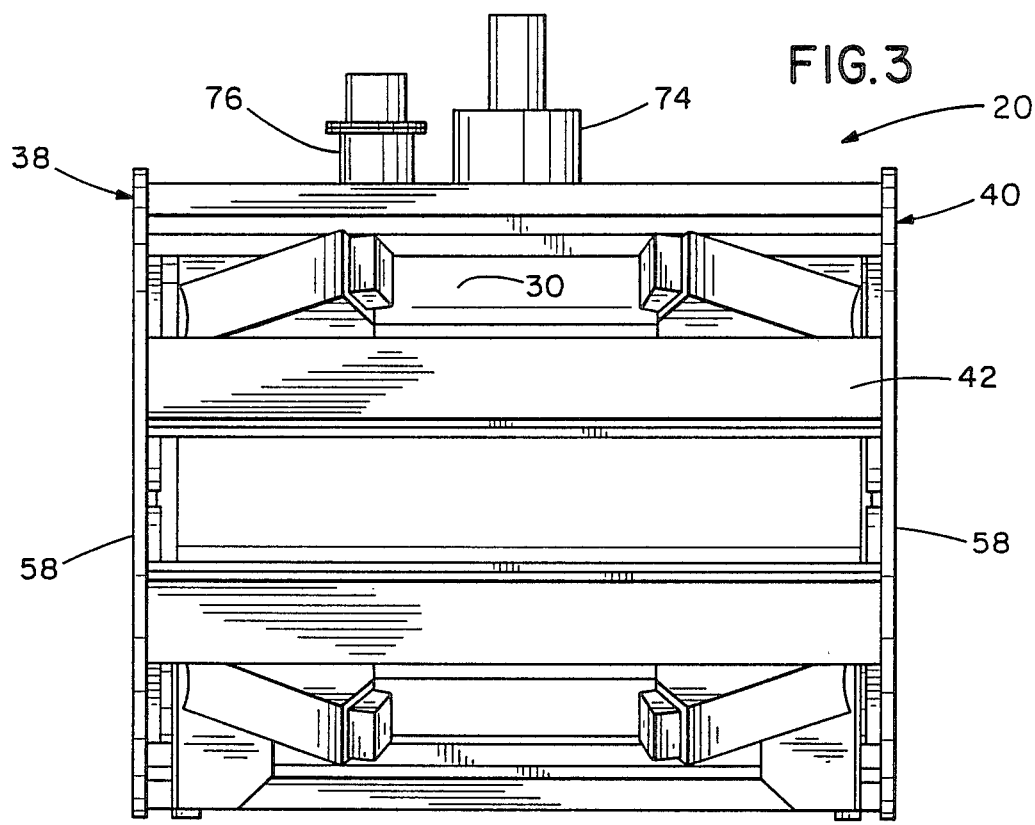
FIG. 3 is a side elevational view of the magnet system of FIG. 1.
Figure 4:
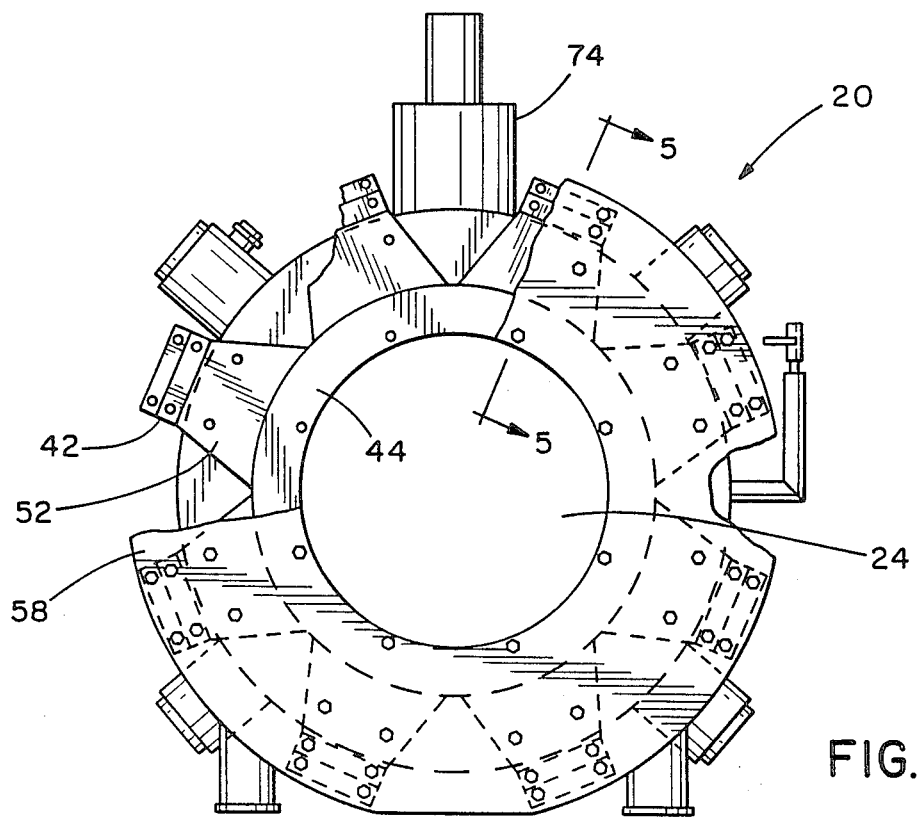
FIG. 4 is an end view of the magnet system of FIG. 1 with a component broken away to expose components of an end assembly of the shield.

Referring now to the drawings, a magnet system embodying various aspects of the present invention is generally indicated by reference numeral 20 in FIGS. 1, 3 and 4. The magnet system 20 includes a substantially cylindrical vacuum vessel 22 defining a bore 24 for receiving the subject (patient) of the imaging. End plates 26, 28 are attached, for example, by welding, adjacent the ends of the vacuum vessel, and beam-like reinforcements 30 extend axially to interconnect the end plates. Supported inside the vacuum vessel by a suspension system (not shown) is a substantially cylindrical cryogenic containment vessel 32.

Figure 2:
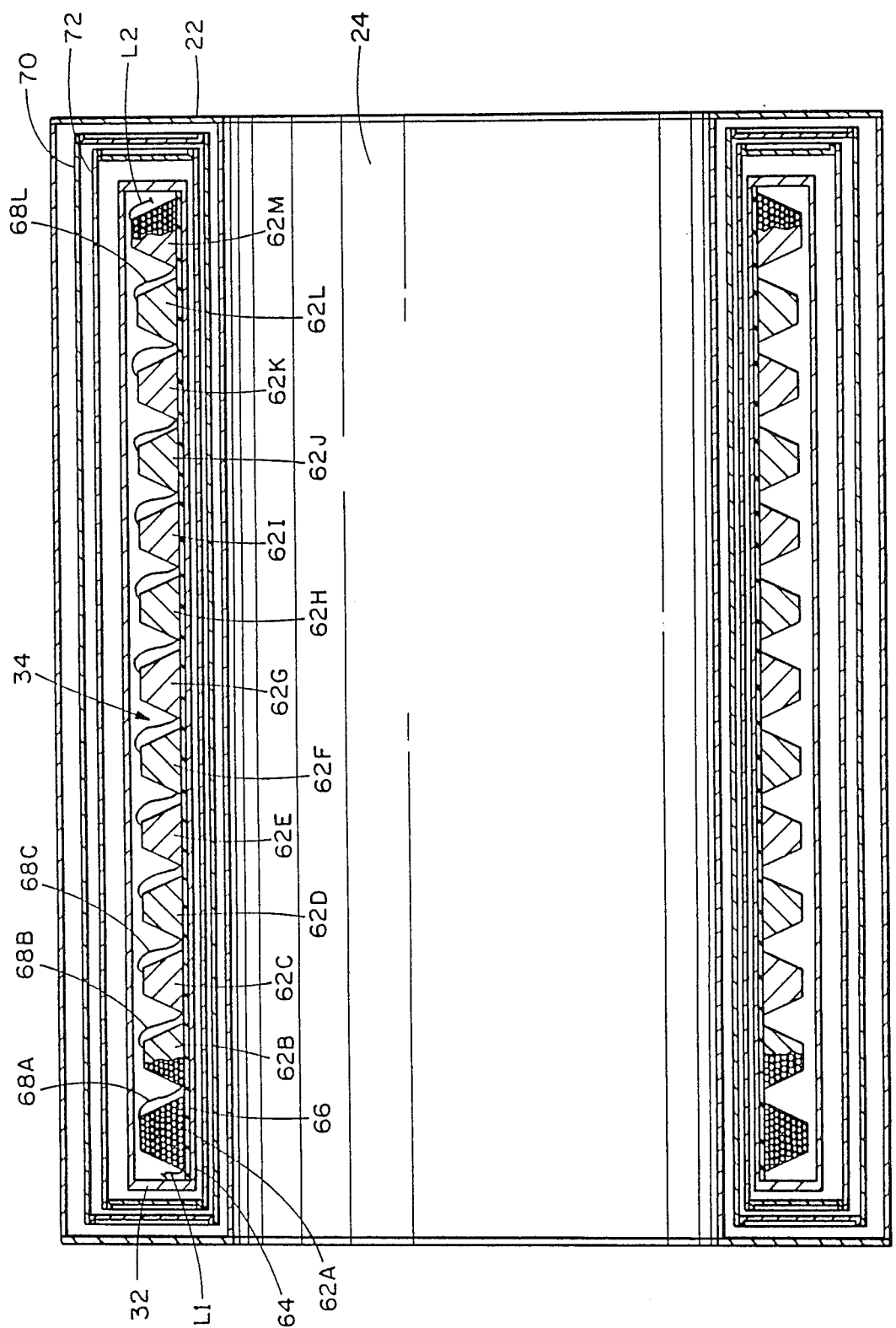
FIG. 2 is a cross-sectional view of the vacuum vessel of FIG. 1 and the magnet components it encloses, showing the winding of the magnet used to achieve intrinsic localized field homogeneity.

As best shown in FIG. 2, a single coil 34 is disposed within the containment vessel for providing a localized, substantially homogeneous magnetic field within at least a portion of the bore 24. The coil is formed by tens of thousands of turns of superconductive wire, preferably having a diameter of between about 10 and 30 mils. The term "single coil" is to be accorded its broad meaning that the various turns of the coil are all in series so that the same current flows through all the turns. It will be appreciated that by using state of the art computer aided design/computer aided manufacturing techniques and equipment, very accurate location of each turn can be achieved. Thus, a single coil can be used to provide a localized area (at the center of the bore) of high field strength and of sufficient homogeneity for use in MRI. Such a coil is fully discussed in commonly-assigned U.S. Pat. No. 4,694,269, the teachings of which are hereby incorporated by reference.

The magnet system 20 further includes a cage-like shield assembly 36 of ferromagnetic material, such as iron or low carbon steel, to provide a high permeability return path for the magnetic lines of force generated by the coil 34 thereby greatly limiting the extent of unacceptably high magnetic field intensity outside of the magnet system 20. The shield assembly 36 includes a first end assembly 38 closely adjacent one end of the vacuum vessel, a second end assembly 40 closely adjacent the other end of the vacuum vessel, and a number of axially extending beam-like members 42 interconnecting the first end and second end assemblies. As will be described more fully hereinafter, the coil 34 is configured to provide the high strength, high homogeneity field inside the bore 24 with the shield assembly installed about the vacuum vessel so that separate field correction coils are not required.

More specifically, the shield assembly 38 is substantially symmetrical about a vertical plane including the axis of the bore 24. There could be from four to twelve regular spaced members 42, and eight members is preferable. Each member 42 could be of one-piece construction or could be formed by a stack of two or more plates.

As each of the end assemblies 38, 40 is substantially identical, only one end assembly need be described in detail. The end assembly includes an inner ring 44 having an inside surface 46 defining an aperture 48 coaxial and coextensive with the bore 24, of the vacuum vessel 22, and an annular outside surface 50. Radially extending from the ring 44 to each of the members 42 is a segment 52.

Figure 5:
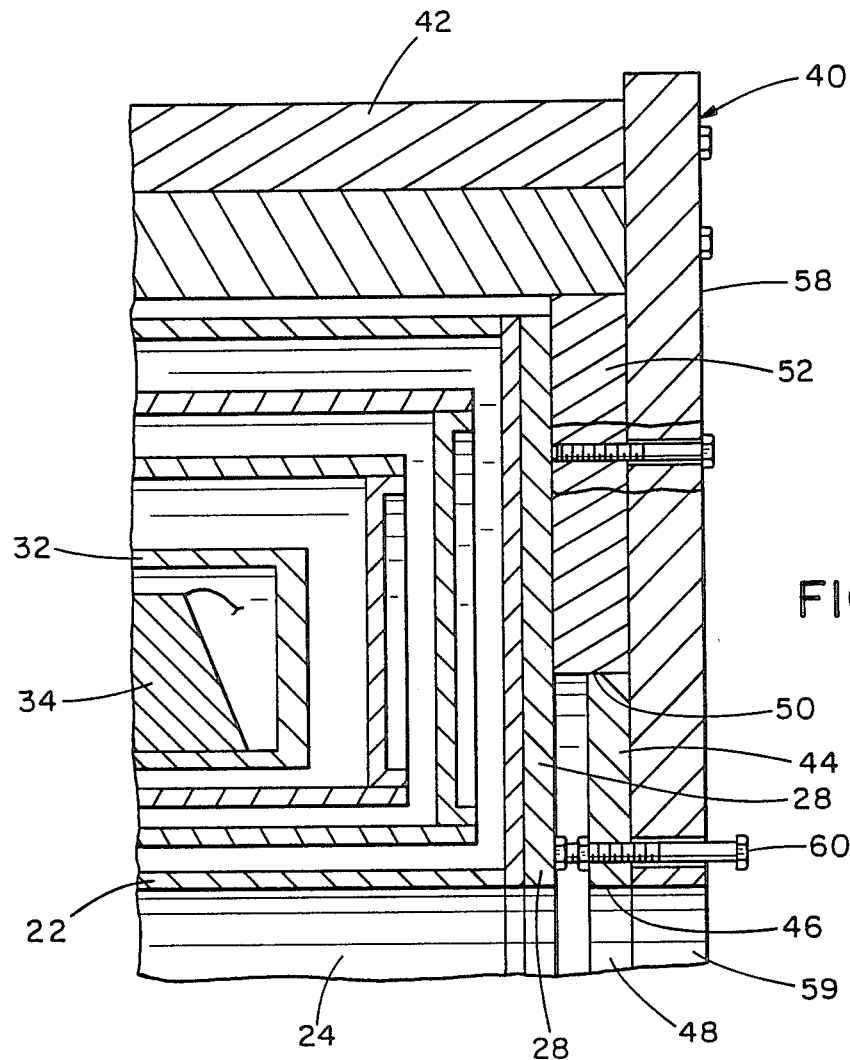
FIG. 5 is a sectional view of the end assembly taken generally along line 5—5 of FIG. 4.
Figure 6:
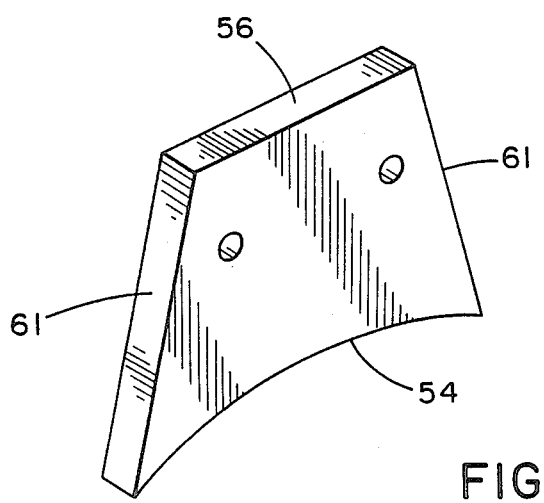
FIG. 6 is an isometric projection of one of a number of segments included in the end assembly.

Referring to FIGS. 4–6, each segment 52 has an arcuate inner surface 54 engaging the outside surface of the ring, and has a flat outside surface 56 engaging its corresponding beam-like member 42. The first end assembly further includes a round flat end plate 58 (having a window 59 matching aperture 48 and bore 24) attached to the end plate welded to the vacuum vessel, by means of a bolt assembly 60 which also holds the inner ring 44 against the end plate 58. The segments 52 and the beam-like members 42 are also bolted to the end plate 58 as shown in FIG. 5. Each segment has a pair of side surfaces 61 which converge radially outwardly so that there is an air space between adjacent segments 52. Furthermore, the segments 52 have thicknesses greater than that of the inner ring 44.

As the magnetic lines of force exit the bore 24, they have a very high density. The inner ring 44 and the overlying portion of the end plate 58 provide a sufficient section of ferromagnetic material for passage of these flux lines without saturation. However, as these lines move radially outwardly toward the members 42, there is a sufficient section of ferromagnetic material provided by the segments 52 and the overlying portion of the end plate 58 to carry the lines of flux without saturation.

Referring to FIG. 2, the coil 34 of the magnet 20 of the present invention is shown as preferably including a winding having a modular geometry with a plurality of axially-spaced wire groupings or modules 62A–62M, the purpose of which (to avoid crack formation during cooling to cryogenic operating temperature) is fully discussed in the above-mentioned U.S. Pat. No. 4,694,269. However, a single winding having a non-modular geometry (a winding wound in layers extending from one end of the containment vessel to the other) could also be used in practicing the present invention.

The single winding coil 34 is designed to provide intrinsic homogeneity (does not require separate homogeneity correction coils) and can be wound using the inner wall 64 of what will later be formed into the containment vessel 30, as a bobbin. An insulative layer 66, preferably wound of an epoxy fiberglass composite, is provided on top of the wall 64 to provide a winding surface. To achieve the necessary field strength and homogeneity, it is necessary that each turn be located precisely and that it not move after positioning. In order to achieve and maintain positive location of each turn, an epoxy resin is preferably used as an interlayer and interturn layup compound.

Referring now to FIG. 2, the coil of the present invention includes the winding of modular geometry having the axially-spaced wire modules 62A–62M with adjacent modules connected by a transition turn 68. Each module can be considered as including a predetermined number of turns supported in predetermined locations in an insulative matrix. The number of turns determine the field strength while the precise placement of each turn affects the homogeneity of the field in the bore. Adjacent modules are preferably fully separated by a small space for voltage standoff.

Referring to FIGS. 1 and 2, the magnet system further includes a pair of radiation shields 70, 72, which are disposed inside vessel 22 and contain the coil containment vessel 32. These radiation shields serve to reflect thermal energy from outside the vacuum vessel that would otherwise radiate to liquid helium which is included with the coil in the containment vessel 32. Space between the various vessels and shields may contain so-called "superinsulation" formed of insulating material, such as aluminized polyester fiber, which further reduces the transmission of thermal energy to the liquid helium.

As shown in FIG. 1, mounted on the outer vacuum vessel 22 is an enclosure 74, housing a liquid nitrogen vessel, and another enclosure 76 which contains the necessary electrical leads and/or switching equipment for controlling operation of the coil. Provided for by the enclosures are power leads, liquid nitrogen boil-off and fill ports and a helium boil-off vent. The magnet system also contains the necessary plumbing to convey liquid helium and liquid nitrogen to their proper locations and to vent their gasses; however, such plumbing and related hardware are well known to those of skill in the art and need not be further discussed here.

One of the advantages of the present invention is that the single coil 34 can be wound to compensate for the presence of the shield assembly 36 so that after the shield assembly is installed, about the vacuum vessel, the coil provides a localized, substantially homogeneous, high strength magnetic field, suitable for medical resonance imaging, at a predetermined location within the bore 24. This avoids the need for shim coils in the patient volume to improve the degree of homogeneity of the field in the bore. In effect, a method of the present invention involves using information gained in constructing a magnet system without a shield having the high degree of homogeneity, and information about the degree of degradation of the homogeneity of the field in the bore of that magnet occasioned by the installation of a shield to enable manufacture of a magnet system including that shield which provides the necessary degree of field homogeneity. By winding the single coil of the magnet with the number and positioning of turns necessary to provide the desired degree of homogeneity properly at the outset, the need for any shim coils or shim rings of ferromagnetic material is precluded.

More specifically, a method of the present invention for manufacturing a magnet system involves the following steps:

A. The magnetic field distribution inside the bore of an existing magnet is mapped. This existing magnet does not have a shield of ferromagnetic material but does provide the desired field strength and homogeneity. It includes a single coil of thousands of turns of small superconductive wire with the number of turns functioning to aid in establishing a field of at least a predetermined strength, and the precise placement of the turns aiding in establishing a substantially homogeneous field at that predetermined location. This mapping can be carried using a commercially available Tesla meter or MR gaussmeter as well known by those of skill in the art.

B. The shield assembly 36 is installed about the vacuum vessel 22 of the existing magnet.

C. The magnetic field distribution is remapped inside the bore of the existing magnet with the shield assembly installed.

D. The changes in the magnetic field distribution resulting from the presence of the shield assembly are determined.

E. The positioning of turns is calculated in a single coil substantially identical to that of the coil of the existing magnet except with the number and/or positioning of turns changed to provide a substantially homogeneous high strength magnetic field at a predetermined location in the bore of a magnet to be formed with a shield assembly installed which is substantially identical to the shield installed about the existing magnet. This calculative step can be performed through an iterative process in which a coil profile is assumed to produce a field which cancels the effect of the presence of the shield assembly. Next the field distribution of the assumed coil profile is calculated for various coordinates within the location of desired field uniformity using the following equations which provide the field resulting from a coil turn or current loop both along the axial (z) direction and a radial direction with respect to the axis of the bore:

$$B_r = \frac{\mu_o I z}{2\pi r} \frac{1}{[(a+r)^2 + Z^2]^{\frac{1}{2}}} \left\{ -K(K) + \frac{a^2 + r^2 + Z^2}{(a-r)^2 + Z^2} E(K) \right\}$$

$$B_Z = \frac{\mu_o I}{2\pi} \frac{1}{[(a+r)^2 + z^2]^{\frac{1}{2}}} \left\{ K(K) + \frac{a^2 - r^2 - Z^2}{(a-r)^2 + Z^2} E(K) \right\}$$

where
 a = the radial distance from the axis of the bore
 z = the distance along the axis
 r = radius of the turn
 $\mu_o = 4\pi(10^{-7})$ h/m (permeability of free space)

$E(K)$ = an elliptic integral of the 2nd kind and is given by $E(K) =$ $$\int_o^{\pi/2} (1 - K^2 \sin^2 \theta)^{1/2} d\theta$$

$K(K)$ = an elliptic integral of the 1st kind and is given by $K(K) =$ $$\int_o^\pi \frac{\pi/2 \, d\theta}{(1 - K^2 \sin^2 \theta)^{1/2}}$$

The next step in the process is to change the coil profile and calculate the field distribution to determine if a greater degree of field homogeneity is achieved. This iterative process is repeated until a coil profile offering the desired degree of field homogeneity in the predetermined location in the magnet bore is realized. This process can be achieved through the use of a computer and attendant software, or by other means as will be understood by one of skill in the art.

F. A magnet having a single coil 34 is manufactured according to the calculations of step E.

G. A shield assembly 36 which is substantially identical to that installed about the existing magnet in step B is installed about the magnet of step F.

Many advantages flow from the magnet system 20 of the present invention having a single coil 34 with a shield assembly 36 to limit strength of the field outside the magnet. An actively shielded magnet system requires a bore having a nominal diameter of 100 cm to accommodate the correction coils and the patient. The magnet system 20 of the present invention can have a smaller bore (although it does not preclude a 100 cm bore), having a diameter as small as 70 cm, because the bore only has to be sized to receive the patient, not the correction coils. For a larger diameter bore, a larger magnet coil system is needed to fill the volume of the bore with the magnetic field of high flux density. The equation for the volume of a cylindrical bore is:

$$V = \pi \frac{d^2}{4} l$$

where:
l = the length of the bore, and
d = diameter of the bore.

Because the bore length can also be reduced proportionately, an 86 cm diameter bore has about one-half the volume of a 100 cm bore. As much less flux is required to achieve the same flux density in the smaller bore 24 of the magnet system 20, the coil 34 can be smaller and lighter. Also because there is less flux to return, there can be a reduction in the size and weight of the shield assembly 36.

Besides having a relatively small size, the magnet system 20 is easy to install at its site because it does not have to be sited in its fully assembled condition. The largest single component that must be sited is the magnet which might have a weight of about 4500 lbs. The various pieces making up the shield assembly 36 (the beam-like members 42, the inner rings 44, the segments 52, and the end plates 58) may be brought in individually and assembled to the end plates 26 and 28 once the magnet has been positioned.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. A method of manufacturing a magnet system for providing a localized, substantially homogeneous, high strength magnetic field, suitable for medical magnetic resonance imaging, at a predetermined location within a bore of the magnet, said method comprising the following steps:

A. mapping the magnetic field distribution inside the bore of an existing magnet, which does not have a shield of ferromagnetic material, providing the desired field and having a single coil made up of thousands of turns of small superconductive wire with the number of turns functioning to aid in establishing a field of at least a predetermined strength, and the precise placement of the turns aiding in establishing a substantially homogeneous field at said predetermined location;

B. installing a shield of ferromagnetic material about said existing magnet;

C. remapping the magnetic field distribution inside the bore of the existing magnet with said shield installed;

D. determining the changes in the magnetic field distribution resulting from the presence of said shield;

E. calculating the positioning of turns in a single coil substantially identical to that of the coil of said existing magnet except with the number and/or positioning of turns changed to provide a substantially homogeneous high strength magnetic field at a predetermined location in the bore of a magnet to be formed with a shield installed which is substantially identical to the shield installed about said existing magnet;

F. manufacturing a magnet with a single coil according to the calculations of step E; and G. installing about the manufactured magnet a shield of ferromagnetic material which is substantially identical to that installed about said existing magnet.

2. A magnet system for providing a localized, substantially homogeneous magnetic field for use in medical magnetic resonance imaging, said magnet system comprising:

a vacuum vessel defining a bore for receiving the subject of the imaging and having a first end and a second end;

a cryogenic containment vessel supported within said vacuum vessel;

a single coil disposed within said containment vessel for providing said magnetic field; and a shield assembly of ferromagnetic material disposed closely adjacent the outside of said vacuum vessel and including a first end assembly adjacent the vacuum vessel first end, a second end assembly adjacent the vacuum vessel second end and a plurality of axially extending beam-like members interconnecting said first and second end assemblies, each of said first and second end assemblies having an aperture coaxial with the axis of said bore, said coil comprising a winding made up of thousands of turns of small superconductive wire and being configured to compensate for the effect of the presence of the shield to provide said substantially homogeneous magnetic field at a predetermined location in said bore, the components of said shield assembly being adapted for mounting to said vacuum vessel after siting whereby the siting of said magnet system is simplified in that the vacuum vessel with the components inside of it can be sited first and the components of the shield assembly then mounted on the vacuum vessel.

3. A magnet system as set forth in claim 2 wherein said members are substantially regularly spaced about the periphery of said vacuum vessel and wherein said first end assembly comprises an inner ring having an inside surface defining the aperture of said end assembly and an annular outside surface, said first end assembly further including a plurality of radially extending segments, there being the same number of said segments as of said members, each segment extending from and engaging the outside surface of said ring to the associated beam-like member, there being an air space between adjacent segments.

4. A magnet system as set forth in claim 3 wherein said ring is supported by the first end of said vacuum vessel.

5. A magnet system as set forth in claim 3 wherein each segment includes an arcuate inner surface engaging said ring, an outside surface engaging its corresponding beam-like member and a pair of side surfaces which converge radially outwardly.

6. A magnet system as set forth in claim 3 wherein said first end assembly further includes a round flat end plate attached to said ring, said segments and said members, said end plate having a window matching the aperture of said ring.

7. A magnet system as set forth in claim 3 wherein said segments have thicknesses greater than that of said ring.

8. A magnet system as set forth in claim 2 wherein said winding has a modular geometry including a plurality of axially serially disposed modules with space provided between adjacent modules.

9. An improvement in a magnet system for providing a localized, substantially homogeneous magnetic field for use in medical magnetic resonance imaging, said system including:

a vacuum vessel defining a bore for receiving the subject of the imaging and having a first end and a second end;

a cryogenic containment vessel supported within said vacuum vessel;

a coil system disposed within said containment vessel for providing said magnetic field, and a shield assembly of ferromagnetic material disposed closely adjacent the outside of said vacuum vessel and including a first end assembly adjacent the vacuum vessel first end, a second end assembly adjacent the vacuum vessel second end and a plurality of axially extending, regularly spaced, beam-like members interconnecting said first and second end assemblies, each of said first and second end assemblies having an aperture coaxial with the axis of said bore, said improvement comprising:

each of said end assemblies including an inner ring having an inside surface defining the aperture of said end assembly and a substantially annular outer surface, radially extending segments, identical in number to said beam-like members, each segment extending between and engaging both the outside surface of said ring and the associated beam-like member, there being an air space between adjacent segments, and a round flat end plate attached to said ring, said segments and said members.

10. A magnet system as set forth in claim 9 wherein each segment has side surfaces which converge radially outwardly.

11. A magnet system as set forth in claim 9 wherein each segment has a thickness greater than that of said ring.

* * * * *

UNITED STATES PATENT AND TRADEMARK OFFICE
CERTIFICATE OF CORRECTION

PATENT NO. : 4,743,880

DATED : May 10, 1988

INVENTOR(S) : Bruce C. Breneman et al.

It is certified that error appears in the above-identified patent and that said Letters Patent is hereby corrected as shown below: On the title page:

Abstract line 9, change "magnetic" to --magnet--.

Column 1, line 55, after "hospital" insert a comma.

Column 6, line 55, change " $\pi/2$ " to -- $\int_0^{\pi/2}$ --.

Column 6, line 60, change " $\overset{\pi}{\underset{0}{}}$ " to -- $\int_0^{\pi}$ --.

Signed and Sealed this

Twenty-second Day of November, 1988

Attest:

DONALD J. QUIGG

*Attesting Officer*     *Commissioner of Patents and Trademarks*